(12) United States Patent
Kho et al.

(10) Patent No.: US 9,417,957 B2
(45) Date of Patent: Aug. 16, 2016

(54) METHOD OF DETECTING BIT ERRORS, AN ELECTRONIC CIRCUIT FOR DETECTING BIT ERRORS, AND A DATA STORAGE DEVICE

(71) Applicant: Infineon Technologies AG, Neubiberg (DE)

(72) Inventors: Rex Kho, Holzkirchen (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 285 days.

(21) Appl. No.: 14/045,923

(22) Filed: Oct. 4, 2013

(65) Prior Publication Data

US 2015/0100827 A1   Apr. 9, 2015

(51) Int. Cl.
*H03M 13/00* (2006.01)
*G11C 29/00* (2006.01)
*G06F 11/10* (2006.01)
*H03M 13/03* (2006.01)
*G06F 11/08* (2006.01)

(52) U.S. Cl.
CPC ............ *G06F 11/1024* (2013.01); *G06F 11/08* (2013.01); *H03M 13/03* (2013.01)

(58) Field of Classification Search
CPC ....... G06F 3/0679; G06F 11/00; G06F 11/08; G06F 11/1044; H03M 13/03; H03M 13/05; H03M 13/1105; G11C 29/42
USPC ............... 714/719, 720, 746, 752–753, 755, 714/757–758, 763, 769, 770–773, 819, 800, 714/805, 824
See application file for complete search history.

(56) References Cited

U.S. PATENT DOCUMENTS

| | | | | |
|---|---|---|---|---|
| 4,949,342 A * | 8/1990 | Shimbo | ................. | H03M 13/15 714/769 |
| 7,003,704 B2 * | 2/2006 | Adams | ................... | G11C 29/40 714/711 |
| 7,779,334 B2 * | 8/2010 | Earle | .................... | G06F 11/1048 365/185.09 |
| 8,510,633 B2 * | 8/2013 | Sakimura | ............ | G06F 11/1008 365/200 |
| 2008/0294938 A1 * | 11/2008 | Kondo | ................ | G06F 11/1068 714/24 |

* cited by examiner

*Primary Examiner* — Christine Tu
(74) *Attorney, Agent, or Firm* — Eschweiler & Associates, LLC

(57) ABSTRACT

A method of detecting bit errors in a data storage device is provided, which includes comparing a first bit sequence accessed during a read out operation of the data storage device with a second bit sequence that corresponds to an expected memory state of the data storage device.

16 Claims, 6 Drawing Sheets

METHOD OF DETECTING BIT ERRORS, AN ELECTRONIC CIRCUIT FOR DETECTING BIT ERRORS, AND A DATA STORAGE DEVICE

FIELD

The disclosure relates to detecting bit errors and more particularly to a method of detecting bit errors in a data storage device, a data storage device, and an electronic circuit for detecting bit errors in a data storage device.

BACKGROUND

Data storage devices are an important component in various kinds of computer technology and electronic data processing applications. A data storage device can be used, for example, for storing user data, on which a data processing is to be performed. As another example, work data or system data, which is needed to carry out the functions of the respective application, can be stored in the data storage device. Typically, in computer and electronic data processing applications, a data storage device stores bit data.

Data storage devices are realized in various types and forms and can comprise, but are not limited to, for example, optical, magnetic, or electronic storage mediums, or a combination thereof. The type and amount of data to be stored in the data storage device and the average storage time depends on the kind of application and the usage and the purpose of the system or device in which the data storage device is operated.

In many applications, measures for enhancement of the reliability, availability, and serviceability of the data storage device are provided so that the data integrity can be increased. For example, a capability of detecting and/or correcting potential bit errors in the bit data can be provided. Such measures include error correcting code (ECC) methods according to which redundant data is computed on the basis of the storage data stored using an algorithm. An error correcting code is often used in applications or devices in which high data integrity is needed. For example, error correcting code can be used in connection with memory modules, such as RAM modules or in other types of volatile or non-volatile memory modules.

However, the error correction and error detection capability provided by an error correcting code is limited such that not more than n bit errors per data bit register can be detected, wherein n depends on the algorithm which is used and the percentage of data overhead produced by adding the redundant data. It is desirable and in many applications necessary to detect more than the above n bit errors, e.g., 100% of the bit errors.

In order to overcome this problem, a method is known in which data in a memory module is counted. For example, if the erased state of a part of the memory module corresponds with a 0 bit, the end of the process steps should comprise a 0. A counting result unlike 0 indicates an error. When one or more errors occur, the number of the data bits unlike a 0 bit can be outputted as a fault tolerant erased state.

However, such a method has the disadvantage that a counter must be available. Further, the method is relatively expensive because of the time needed to count the data and because of the amount of logic and/or software, which is needed to identify 1, 2, or n errors as fault tolerant erased state.

SUMMARY

A method of detecting bit errors in a data storage device is disclosed. According to the method, a first bit sequence accessed during a read out operation of the data storage device is compared with a second bit sequence that corresponds to an expected memory state of the data storage device.

Further, a corresponding data storage device is disclosed, which comprises data storage means for storage of bit data and comparing means.

The comparing means of the data storage device are configured to compare a first bit sequence accessed during a read out operation of the data storage device with a second bit sequence that corresponds to an expected memory state of the data storage device.

Moreover, an electronic circuit for detecting bit errors in a data storage device is disclosed, wherein the electronic circuit comprises a comparing component or means configured to compare a first bit sequence which is accessed during a read out operation of the data storage device with a second bit sequence that corresponds to an expected memory state of the data storage device.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated, as they become better understood by reference to the following detailed description.

DETAILED DESCRIPTION

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

Figure 1:
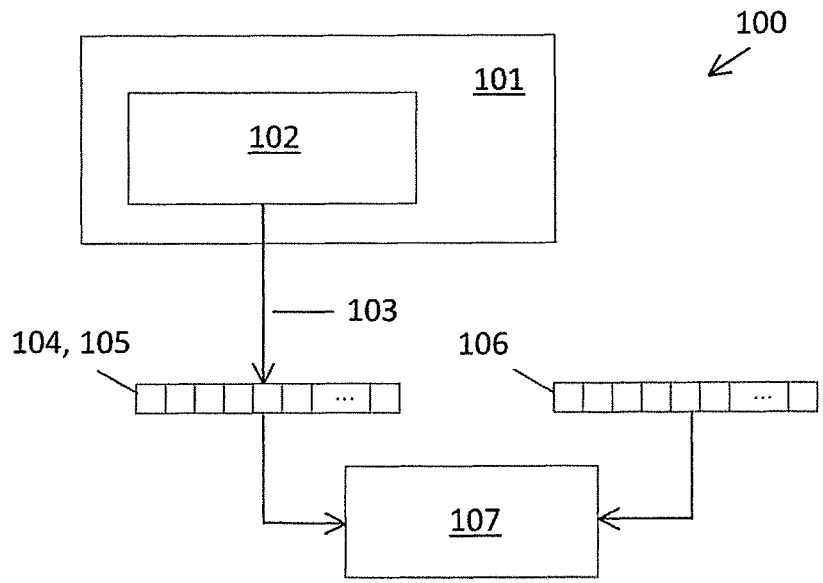
FIG. 1 depicts a schematic structure of an exemplifying data storage device comprising a data storage means and a comparing means.

FIG. 1 depicts a schematic structure of an exemplifying data storage device 100 comprising a data storage component or means 101 and a comparing component or means 107. The data storage means 101 can comprise a memory module, for example, a semiconductor memory module such as a RAM, DRAM, a flash memory, or another convenient memory module. According to one embodiment, the data storage means 101 comprise an error correction code memory, i.e. a memory comprising means for error correction code encoding and/or decoding. While in this embodiment the data storage means 101 may comprise a memory module, the disclosure is not limited to memory modules. Therefore, in other embodiments the data storage means 101 comprise a magnetic and/or optic data storage device or another type of data storage device.

According to the embodiment in FIG. 1, the data storage means 101 further comprise a memory field and/or a memory array 102 for storing bit data, which can be accessed by a read operation 103 and/or a write operation. Further, the data storage device 100 may comprise a read register 104 in which a first bit sequence 105 accessed during a read out operation of the data storage device 100 can be stored.

Further, the data storage device 100 can have a second bit sequence 106 which may correspond to an expected memory state of the data storage device 100. In one embodiment, the second bit sequence 106 corresponds with an erased memory state of the data storage device 100. Furthermore, the second bit sequence 106 can correspond with an erased memory state of a memory register or assembly buffer or of a bit sequence stored in the memory array 102. In such a case, all bits of the second bit sequence 106 can be 0, when a 0 bit corresponds with an erased memory state. Alternatively, all bits of the second bit sequence 106 can be 1, when a 1 bit corresponds with an erased memory state.

As shown in FIG. 1, the data storage device 100 further may be equipped with a comparing means 107 configured to compare the first bit sequence 105 with the second bit sequence 106.

In one embodiment, the comparing means 107 comprise a XOR operation component or means. In one embodiment a XOR operating means or XOR gate already existent in the data storage device is used.

Figure 2:
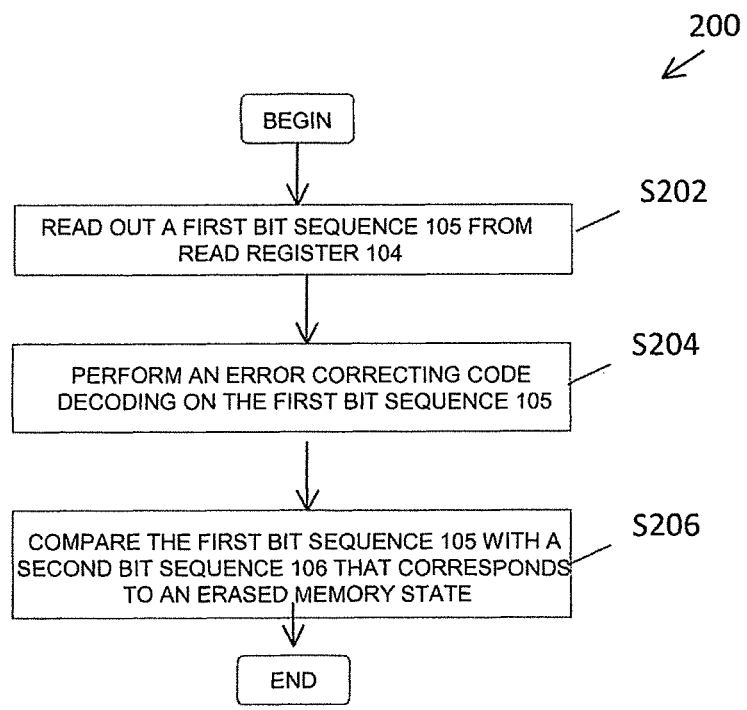
FIG. 2 depicts a schematic flow chart of a method of detecting bit errors in a data storage device according to a first example embodiment of the disclosure.

FIG. 2 depicts a schematic flow chart of a method 200 of detecting bit errors in a data storage device according to a first example embodiment. In detail, the method 200 according to the embodiment in FIG. 2 comprises an act S202 in which a first bit sequence 105 is read out from read register 104. At S204, an error correcting code decoding is performed on the first bit sequence 105. Further, at S206, the first bit sequence 105 is compared with a second bit sequence 106 which corresponds to an erased memory state.

Figure 3:
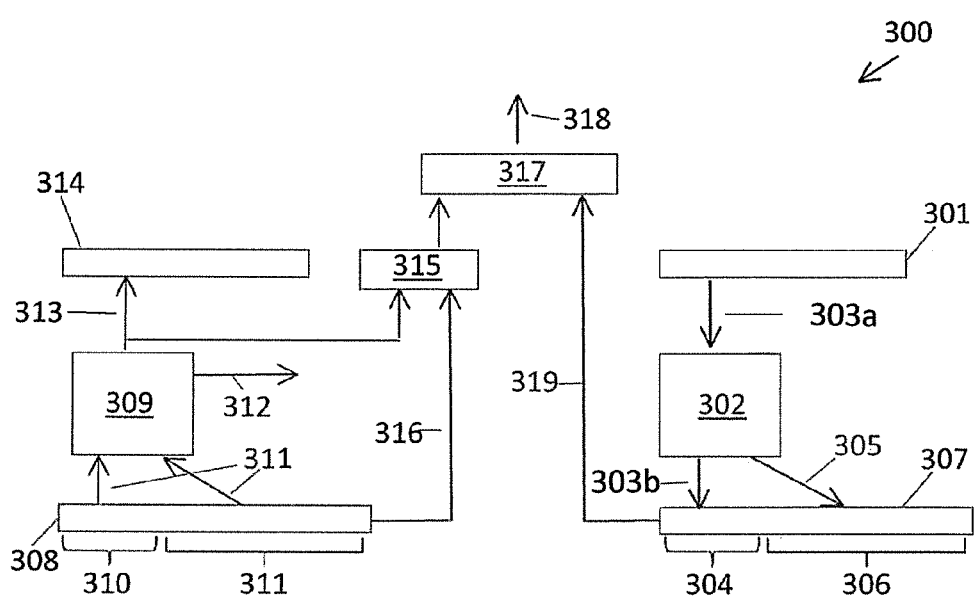
FIG. 3 depicts a schematic structure of components of an exemplifying electronic circuit for detecting bit errors comprising a comparing means for comparing a first and a second bit sequence.

FIG. 3 depicts a schematic structure of components of an exemplifying electronic circuit 300 for detecting bit errors in a data storage device 100. According to the example embodiment shown in FIG. 3, the electronic circuit 300 is connected with a write register 301. In addition, in one embodiment the electronic circuit 300 can also comprise an error correcting code encoder 302. Further, the write register 301 can be connected with the error correcting code encoder 302 which therefore may receive 303*a* data bits written in the write register 301.

In response to receiving 303*a* data bits from the write register 301, the error correcting code encoder 302 can perform an error correcting code encoding which results in an output 303*b* of error correcting code bits 304 and an output 305 of data bits 306.

In one embodiment the electronic circuit 300 further comprises an assembly buffer 307 for intermediate storage of the error correcting code bits 304 and data bits 306.

According to an example embodiment of the disclosure, the data bit length is for example 128 bits, wherein the error correcting code bit length is for example 22 bits. However, according to other embodiments the data bit length is shorter or longer than 128 bits, for example 64 bits or 256 bits. Further, according to alternative embodiments, the bit length of the error correcting code bits is shorter or longer than 22 bits.

As shown in FIG. 3, the electronic circuit 300 may further comprise a read register 308 and an error correcting code decoder 309. Similarly, the read register 308 can store error correcting code bits 310 of, for example, 22 bits length, and data bits 311 of, for example, 128 bits length, corresponding to the error correcting code bits-304 and data bits 306 outputted from the error correcting code encoder 302 and stored in the assembly buffer 307.

In this embodiment, the error correcting code bits 310 and the data bits 311 are read out by the error correcting code decoder 309 which can calculate and output 312 an error correcting code compare result.

Further, the error correcting code decoder 309 can be connected 313 to prefetch buffers 314 for outputting and further processing the read out data. Further, the output of the error correcting code decoder 309 may also be connected to a multiplexer 315 which multiplexes the error correcting code processed and/or corrected output of the error correcting code decoder 309 on the one hand and the bits stored in and output 316 from the read register 308 on the other hand. Furthermore, in one embodiment multiplexer 315 is connected to a comparing component or means 317. Therefore, selectively the output 316 of the read register 308 or the bits output from the error correcting code decoder 309 can be compared in the comparing means 317 against comparing bits.

According to one embodiment, the comparing means 317 performs an XOR operation, and outputs 318 a corresponding compare result.

Further, according to one embodiment of the disclosure, the assembly buffer 307 is also connected 319 to the comparing means 317.

Figure 4:
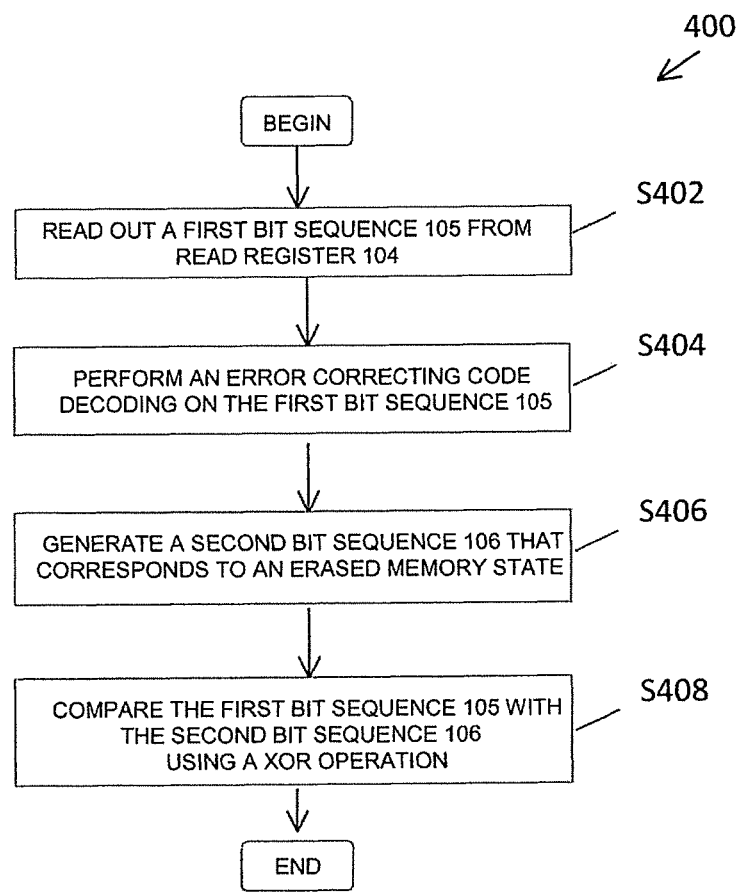
FIG. 4 depicts a schematic flow chart of a method of detecting bit errors in a data storage device according to a second example embodiment of the disclosure.

FIG. 4 depicts a schematic flow chart of a method 400 of detecting bit errors in a data storage device according to a second example embodiment of the disclosure.

Similar to the first embodiment described in connection with FIG. 2, according to method 400, at S402 a first bit sequence 105 is read out from a read register 104. Further, at S404, an error correcting code decoding is performed on the first bit sequence 105.

At S406, a second bit sequence 106, which corresponds to an erased memory state, is generated. Finally, at S408, the first bit sequence 105 and the second bit sequence 106 are compared in a XOR operation.

The electronic circuit 300 described in connection with FIG. 3 can perform different possible verifies, examples of which are described in the following FIGS. 5 to 7 in more detail in connection with example embodiments.

Figure 5:
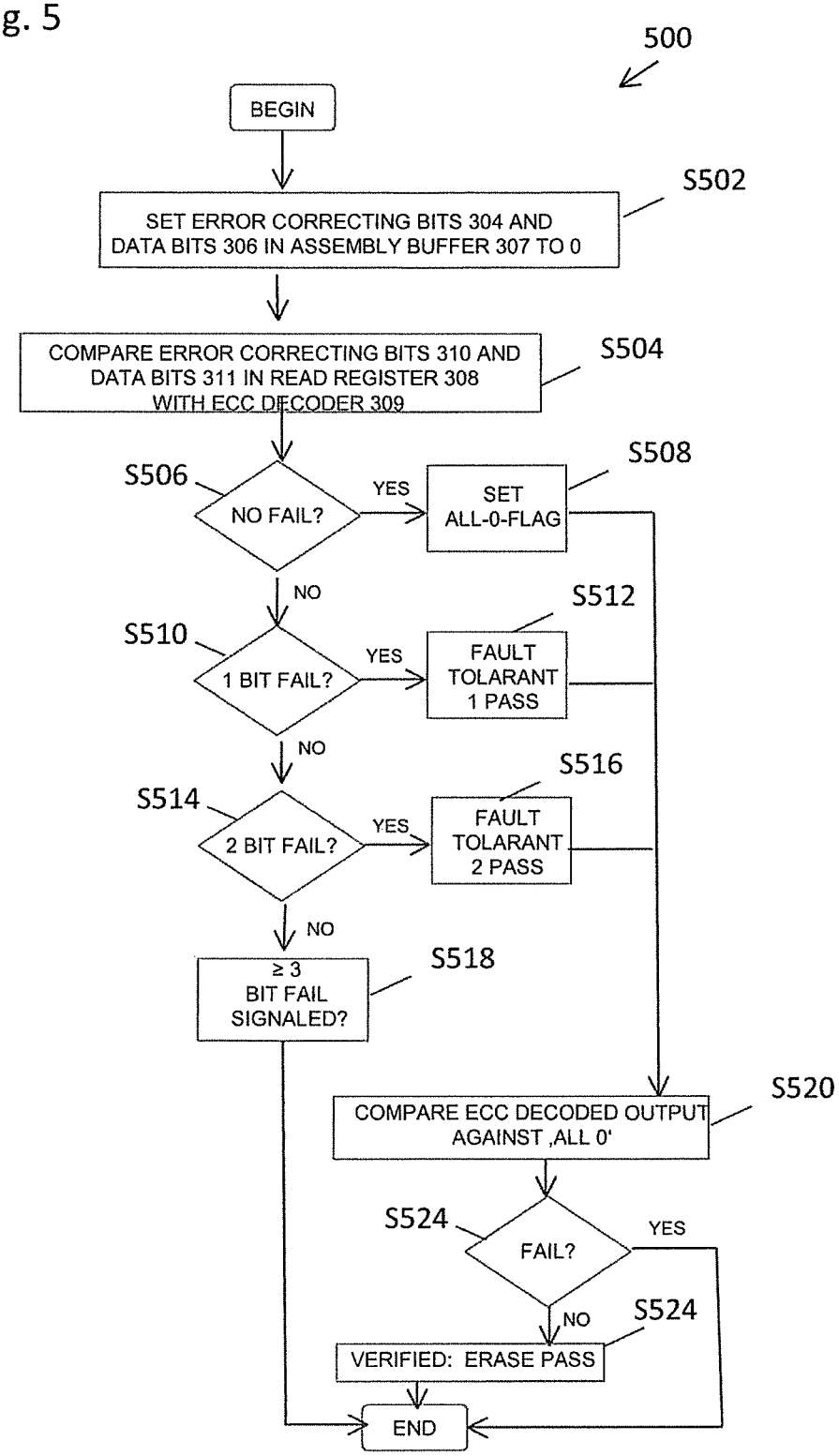
FIG. 5 depicts a schematic flow chart of a method of detecting bit errors in a data storage device according to a third example embodiment of the disclosure.

FIG. 5 depicts a schematic flow chart of a method 500 of detecting bit errors in a data storage device, according to a third example embodiment of the disclosure.

As shown in FIG. 5, at S502 error correcting bits 304 and data bits 306 in assembly buffer 307 are set to 0. At S504, error correcting bits 310 and data bits 311 read out of read register 308 are compared by means of error correcting decoder 309, without the use of address bits (address ECC off). In one embodiment it is desirable to use an existing error correction code circuit to detect and correct an inaccurate erased memory field. However, due to the limited size of the used error correction code circuit, with the error correction code circuit alone the amount of correctable bit errors is limited to n.

In the following, based on the type of error correcting code, one or more results of the error correcting code decoding can be checked.

According to the example third embodiment discussed in connection with FIG. 5, a DECTEC (double error correction triple error detection) error correction code is used. However, in other embodiments of the disclosure, other error correction codes can be used.

At S506 it is checked, if the error correction code decoding gives a no fail result. In such a case, at S508 an all-0-flag is set, which according to this embodiment means a non-fault tolerant erase pass. Otherwise, when at S506 the answer is no, at S510 a 1 bit fail is checked. In such a case, when at S510 an 1 bit fail is determined, at S512 a fault tolerant 1 pass is verified.

Otherwise, when at S510 the answer is no, at S514, the occurrence of a 2 bit fail is checked. In such a case, when at S514 a 2 bit fail is determined, at S516 a fault tolerant 2 pass is verified.

Further, when at S514 the answer is no, at S518 a 3 or more bit fail is signaled.

It is possible, that a 4 or more bit fail can occur, which is seen as 0, 1, or 2 bit fail. Therefore, it has to be formally verified that if more than 3 errors, for example, 3 ones on all zero data, on the input of the error correcting block (e.g. the error correcting code encoder 302 in FIG. 3) occur with address ECC off, then at least one 1-bit will remain on the output of the error correcting block (e.g. the error correcting decoder 309).

Therefore, according to act S520, the error correcting code decoder 309 output is compared against all-0. When the comparison results in a fail, then according to act S522 no erase pass verifying can be done. However, when the comparison is positive and does not result in a failure, then at S524 an erase pass can be verified. This fits to a theory that only 1 or 2 bits are correctable, and 3 or more bits are detectable but not repairable.

Figure 6:
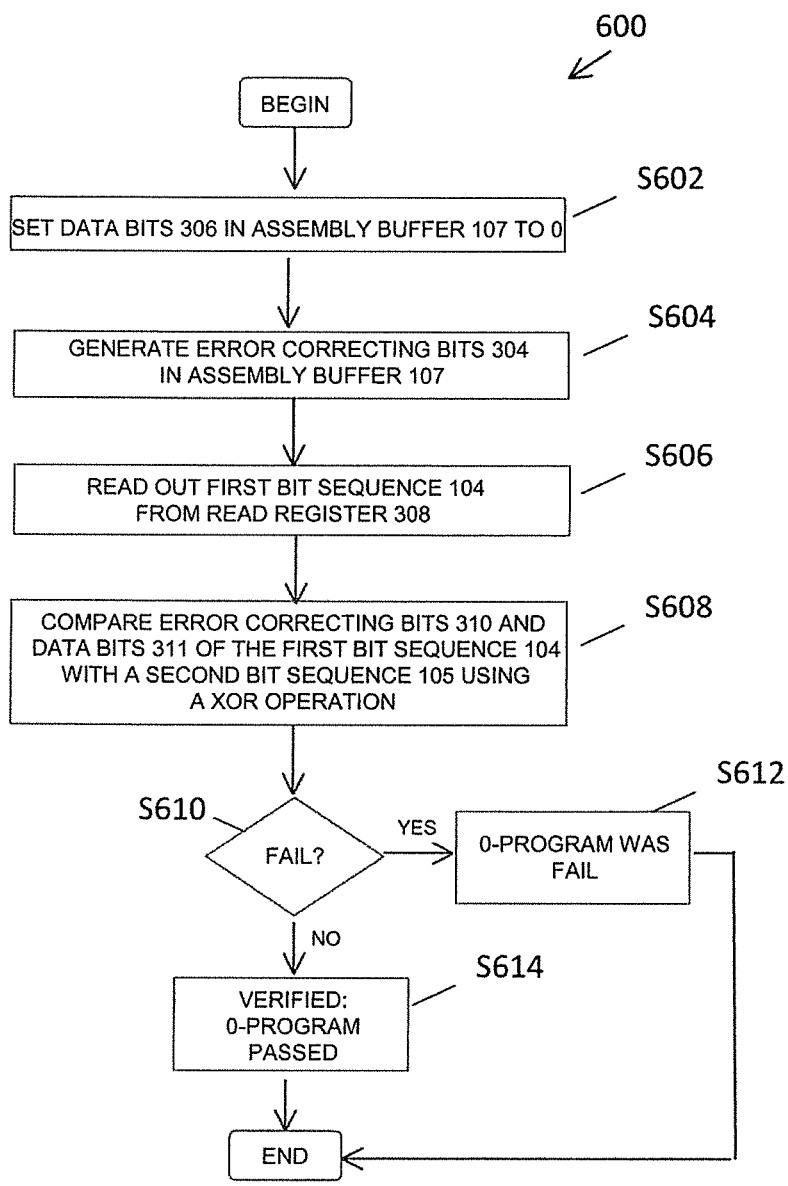
FIG. 6 depicts a schematic flow chart of a method of detecting bit errors in a data storage device according to a fourth example embodiment of the disclosure.

FIG. 6 depicts a schematic flow chart of a method 600 of detecting bit errors in a data storage device according to a fourth example embodiment of the disclosure.

As shown in FIG. 6, according to act S602, all the data bits in the assembly buffer 307 are set to 0. Further, at S604, the error correcting bits 304 in the assembly buffer 307 are generated by use of an error correcting code encoder 302. At S606, a first bit sequence 104 is read out from a read register 308.

Further, at S608, the error correcting bits 310 and data bits 311 of the first bit sequence 104 are compared with a second bit sequence 105 using a XOR operation. Then, at S610 it is determined, if the comparing at S608 results in a fail or not. Therefore, when the answer is yes, at S612, a 0-program fail is noted. Otherwise, when the answer is no, and therefore no fail detection occurred, at S614 a 0-program pass can be verified.

Figure 7:
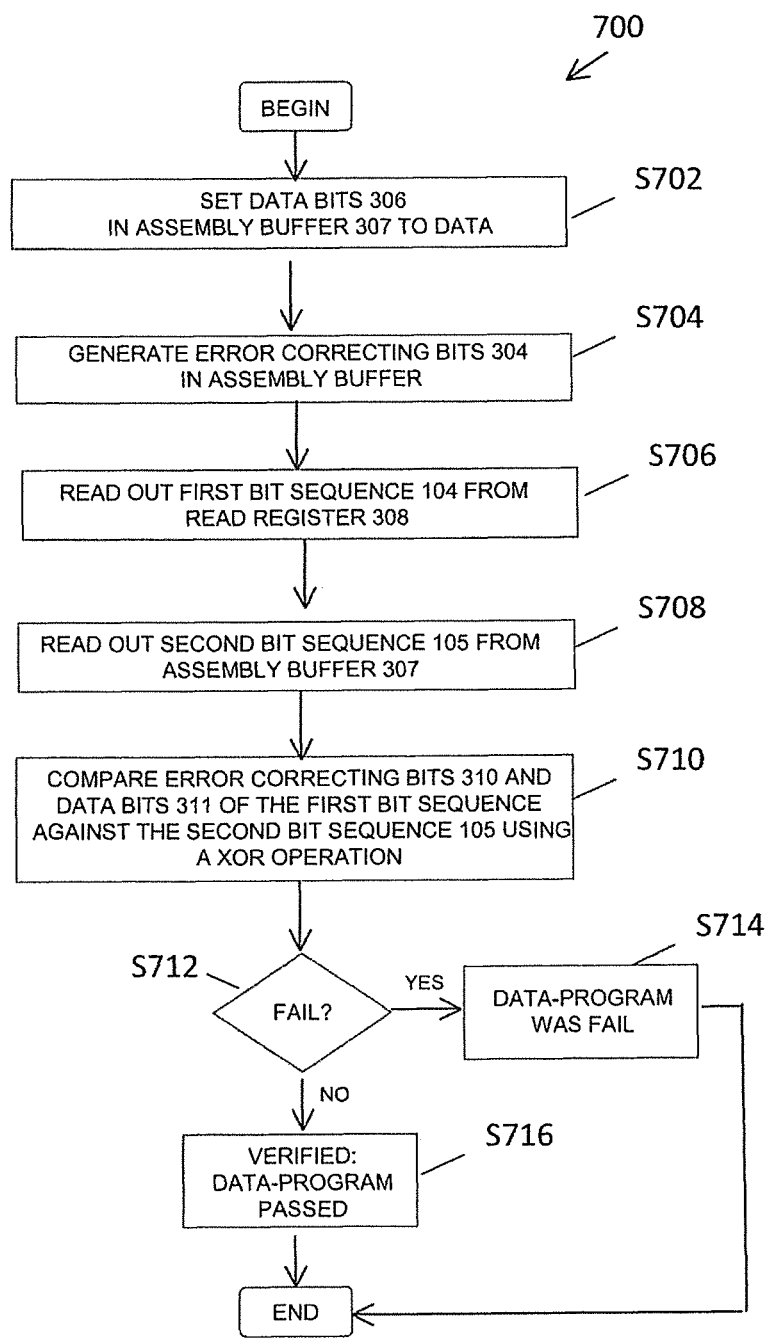
FIG. 7 depicts a schematic flow chart of a method of detecting bit errors in a data storage device according to a fifth example embodiment of the disclosure.

FIG. 7 depicts a schematic flow chart of a method 700 of detecting bit errors in a data storage device according to a fifth example embodiment of the disclosure.

As shown in FIG. 7, according to act S702, all the data bits 306 in the assembly buffer 307 are set to 0. Further, at S704, the error correcting bits 304 in the assembly buffer 307 are generated by use of an error correcting code encoder 302. At S706, a first bit sequence 104 is read out from a read register 308.

Further, at S708, error correcting bits 310 and data bits 311 of the first bit sequence 104 are compared with a second bit sequence 105 using a XOR operation. Then, at S710 it is determined, if the comparing at S608 results in a fail or not. Therefore, when the answer is yes, at S712, a data-program fail is noted. Otherwise, when the answer is no, and therefore no fail detection occurred, at S714 a data-program pass can be verified.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method of detecting bit errors in a data storage device, comprising:
    performing an error correcting code decoding operation on a first bit sequence read out from the data storage device to error correct the first bit sequence;
    comparing the error corrected first bit sequence with a second bit sequence that corresponds to an expected memory state of the data storage device to detect an uncorrected bit error or to confirm that no remaining bit errors are comprised in the first bit sequence.

2. The method of claim 1, wherein the comparing of the first bit sequence and the second bit sequence comprises performing an XOR operation using the first bit sequence and the second bit sequence.

3. The method of claim 2, wherein the first bit sequence or the second bit sequence, or both, comprise a first part that corresponds to error correcting code bits and a second part that corresponds to a data bit string.

4. The method of claim 3, wherein all bits of the second bit sequence are 0 or wherein all bits of the second bit sequence are 1 or wherein the second bit sequence corresponds to an erased memory state.

5. The method of claim 3, further comprising:
    setting all bits in the second bit sequence to 0 or setting all bits of the data bit string in the second bit sequence to 1; and
    after setting the bits of the data bit string in the second bit sequence, generating an error detection code of the second bit sequence by performing an error detection code encoding on the data bit string.

6. The method of claim 3, further comprising:
    generating the second bit sequence using a write buffer and/or an assembly buffer of the data storage device.

7. The method of claim 3, further comprising:
    reading out the first bit sequence from an array of the data storage device and/or reading out the first bit sequence from a read register of the data storage device.

8. The method of claim 3, further comprising:
    setting the data bit string of the first bit sequence to a predetermined program data string; and
    generating an error detection code of the first bit sequence on the data bits of the predetermined program data string.

9. The method of claim 1, further comprising:
    performing an error correcting code calculation without a use of address bits.

10. The method of claim 1, wherein an output result of the error correcting code decoding operation is used as the second bit sequence.

11. The method of claim 10, wherein the error correcting code decoding operation comprises a double error correcting triple error detection operation.

12. A data storage device, comprising:
   an error correcting component configured to perform an error correcting operation on a first bit sequence stored in the data storage device to error correct the first bit sequence; and
   a comparing component configured to compare a second bit sequence that corresponds to an expected memory state of the data storage device with the error corrected first bit sequence.

13. The data storage device of claim 12, wherein the comparing component is configured to perform the comparing of the first bit sequence and the second bit sequence by using an XOR gate of the data storage device.

14. The data storage device of claim 12, wherein the data storage device is a volatile semiconductor data storage device or a nonvolatile semiconductor data storage device.

15. An electronic circuit for detecting bit errors in a data storage device, comprising:
   an error correcting circuit configured to perform an error correcting operation on a first bit sequence stored in the data storage device to error correct the first bit sequence; and
   a comparing circuit configured to compare the error corrected first bit sequence with a second bit sequence that corresponds to an expected memory state of the data storage device.

16. The electronic circuit of claim 15, wherein the comparing component is configured to perform the comparing of the first bit sequence and the second bit sequence using an XOR gate of the data storage device.

* * * * *